United States Patent
Buescher et al.

(10) Patent No.: US 6,556,078 B2
(45) Date of Patent: Apr. 29, 2003

(54) INTEGRATED LOW-CORNER FREQUENCY HIGH PASS FILTER CIRCUIT

(75) Inventors: Kevin Scott Buescher, Colorado Springs, CO (US); James Harold Lauffenburger, Colorado Springs, CO (US)

(73) Assignee: EM Micoelectronics-US, Inc, Colorado Springs, CO (US)

( * ) Notice: Subject to any disclaimer, the term of this patent is extended or adjusted under 35 U.S.C. 154(b) by 54 days.

(21) Appl. No.: 09/845,626

(22) Filed: Apr. 30, 2001

(65) Prior Publication Data

US 2002/0158687 A1 Oct. 31, 2002

(51) Int. Cl.[7] ................................................. H03F 1/36
(52) U.S. Cl. ............................ 330/85; 330/69; 330/253; 330/303; 327/552
(58) Field of Search ....................... 330/69, 85, 253, 330/303, 306; 327/552, 559

(56) References Cited

U.S. PATENT DOCUMENTS 4,543,536 A * 9/1985 Pederson ..................... 330/85
4,577,336 A * 3/1986 Kriedt et al. ................ 377/111
5,325,073 A * 6/1994 Hasegawa ................... 330/290
5,327,027 A * 7/1994 Taylor ......................... 307/490

FOREIGN PATENT DOCUMENTS

JP           53-129569    * 11/1978    .................. 330/85

* cited by examiner

Primary Examiner—Henry Choe
(74) Attorney, Agent, or Firm—Law Office of Dale B. Halling, LLC

(57) ABSTRACT

A low-corner frequency high pass filter circuit (10) includes an operational amplifier (12). The operational amplifier (12) has an inverting input (14) and a non-inverting input (24). A series capacitor (26) has a first end connected to the non-inverting input (24) of the operational amplifier (12). A second end of the series capacitor (26) is connected to an input signal (28). A low gain amplifier (30) has an input connected to an output (22) of the operational amplifier (12) and has an output (32) connected to the non-inverting input (24) of the operational amplifier (12). The low gain amplifier (30) performs the function of large value resistor.

9 Claims, 2 Drawing Sheets

INTEGRATED LOW-CORNER FREQUENCY HIGH PASS FILTER CIRCUIT

FIELD OF THE INVENTION

The present invention relates generally to the field of solid state integrated filter circuits and more particularly to a low-corner frequency high pass filter circuit in an integrated circuit.

BACKGROUND OF THE INVENTION

In order to build a high pass filter with a pole at very low frequencies it is necessary to have large a resistance and capacitance in the circuit. In integrated circuits it is extremely difficult to build large capacitors and resistors. In addition, it is expensive to build large value resistors and capacitors which require a lot of die area, as cost is proportional to die area.

The cost issue and other challenges might be better understood with an example. A typical high-pass filter might require a corner frequency of 100 Hz, which in a discrete implementation might use a 160 kiloOhm resistor and a 10 nanoFarad capacitor. If this was implemented in an integrated circuit, the parameters that might be typical are 1k ohm per 10 micrometers$^2$ of area for an "n-well" resistor, and 0.1 femtoFarad per micrometer$^2$ for a metal-to-metal capacitor. Thus, this RC filter would require approximately 100 mm$^2$ of die area, which is extremely large for an IC, and very expensive. In an attempt to reduce the die area, one might make the resistor larger and the capacitor smaller. However, the large resistor causes offset problems. If the resistor is raised to 16 megOhms, and the capacitor reduced to 100 picoFarads, then the die area required is approximately 2.6 mm$^2$, which is still very large. Even worse though, is the fact that circuit offsets become very difficult. The 16 megOhm resistor must not be loaded by a small impedance of the circuit following this low-pass. If it is loaded even by a 1600 megOhm resistor, then there will be a 1% error; but such a high load impedance is extremely challenging, and nearly impossible. If there is a tiny leakage current of only 10 nanoAmps through the 16 megOhm resistor, then the result is 160 milliVolts of offset, which is much larger than many important analog signals in ICs.

This example shows the fundamental problems of creating a long time constant high-pass filter on an integrated circuit. Usually at least 2 problems occur: 1) a large use of die area is required, or 2) large offset voltage errors are introduced.

Thus there exists a need for a low-corner frequency high pass filter circuit that does not require large die areas, and that is capable of not introducing significant voltage offset errors.

DETAILED DESCRIPTION OF THE DRAWINGS

A low-corner frequency high pass filter circuit includes an operational amplifier. The operational amplifier has an inverting input and a non-inverting input. A series capacitor has a first end connected to the non-inverting input of the operational amplifier, A second end of the series capacitor is connected to an input signal. A low gain amplifier has an input connected to an output of the operational amplifier and has an output connected to the non-inverting input of the operational amplifier. The low gain amplifier essentially performs the function of large value resistor. In addition a low gain amplifier does not require the die space of large value resistor and therefor is less expensive to build in an integrated circuit. In one embodiment, the low gain amplifier is two amplifiers with their outputs subtracted.

Figure 1:
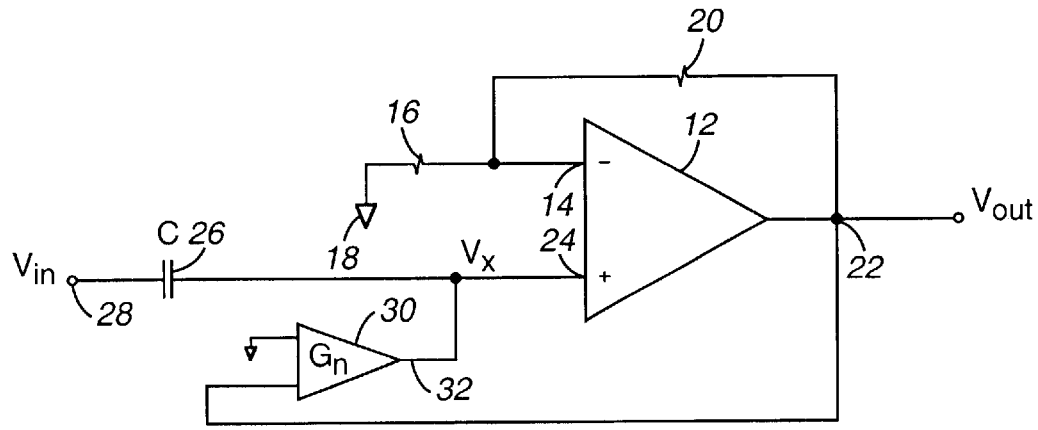
FIG. 1 is a block diagram of a low-corner frequency high pass circuit in accordance with one embodiment of the invention.

FIG. 1 is a block diagram of a low-corner frequency high pass circuit 10 in accordance with one embodiment of the invention. The circuit includes an operational amplifier 12 having an inverting input 14 connected to a first resistor 16. The first resistor 16 is connected to ground 18. A feedback resistor 20 has a first end connected to the inverting input and a second end connected to an output 22 of the operational amplifier 12. A non-inverting input 24 is connected to a series capacitor 26. A second end of the series capacitor 26 is connected to an input signal 28. A low gain amplifier 30 has an input connected to the output 22 of the operational amplifier 12. The output 32 of the low gain amplifier 34 is connected to the non-inverting input 24 of the operational amplifier 12. In one embodiment, the low gain amplifier is formed by a first differential amplifier and a second differential amplifier. The first differential amplifier has a first input connected to a reference voltage. The second differential amplifier has a first input connected to the reference voltage and a second input connected to a second input of the first differential amplifier. A subtractor is connected to the outputs of the first differential amplifier and the second differential amplifier. Note that a first gain of the first differential amplifier is different than a second gain of the second differential amplifier. By connecting the 2 differential pair outputs together the overall gain is the difference between the gain of 1 and 2. This lower overall gain is achieved which results in a reduced cutoff frequency of the circuit.

In another embodiment, a parallel capacitor (second capacitor) is connected to the series capacitor by a switching network. This allows the circuit to change its corner frequency by changing the input capacitance.

Figure 2:
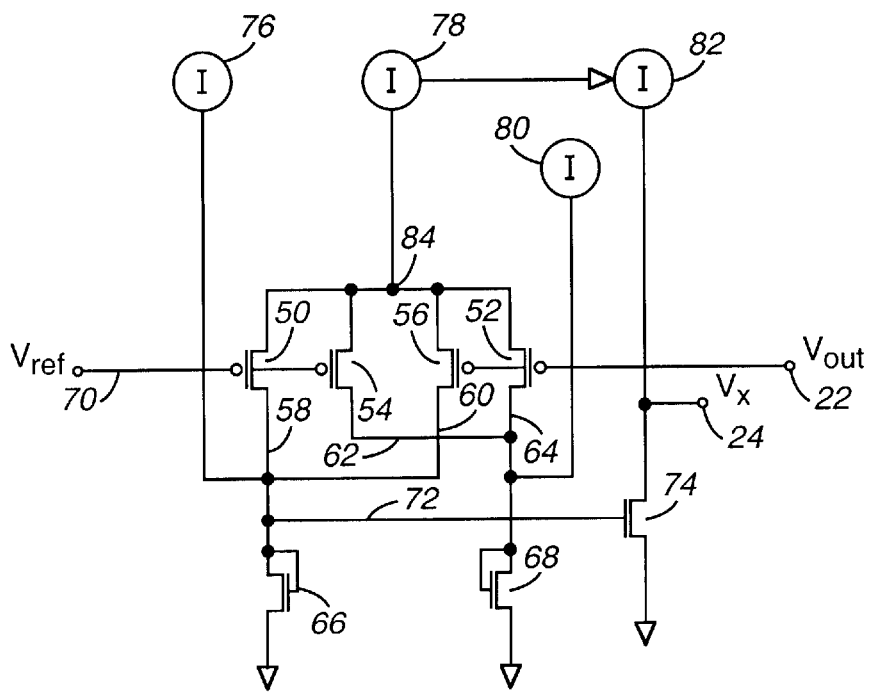
FIG. 2 is a schematic diagram of a transconductance amplifier circuit in accordance with one embodiment of the invention.

FIG. 2 is a schematic diagram of a transconductance amplifier circuit 30 in accordance with one embodiment of the invention. The amplifier circuit 30 contains a first differential amplifier (first amplifier) and a second differential amplifier (second amplifier). The first differential amplifier is formed by the outer pair of transistors 50, 52. The second differential amplifier is formed by the inner pair of transistors 54, 56. Note that transistors 50, 52 are a matched pair as are transistors 54, 56. However, transistor 50 and 54 are not a matched pair. Note that the source 58 of transistor 50 is connected to the source 60 of the transistor 56 and the source 62 of transistor 54 is connected to the source 64 of the transistor 52. This crossing of the sources of the differential amplifiers results in subtracting the outputs of the differential amplifiers. The diode connected transistors 66, 68 are current sinks. The inputs to the differential amplifiers is a reference voltage 70 and the output 22 of the operational amplifier 12 (See FIG. 1). The output 72 of the differential amplifiers drives a transistor 74 that is connected to the output 24 (non-inverting input of the operational amplifier).

A plurality of current mirrors 76, 78, 80, 82 are necessary to provide sufficient current at the output since the amplifier has a very low gain. These also provide better matching because of the use of larger NMOS current mirrors. A first current mirror 78 is connected to a drain 84 of the first differential amplifier. A second current source 76 is connected to a source 58 of the first differential amplifier. A third current source 80 is connected to a source 64 of the second differential amplifier. The fourth current source 82 is connected to the non-inverting input 24 of the operational amplifier.

Figure 3:
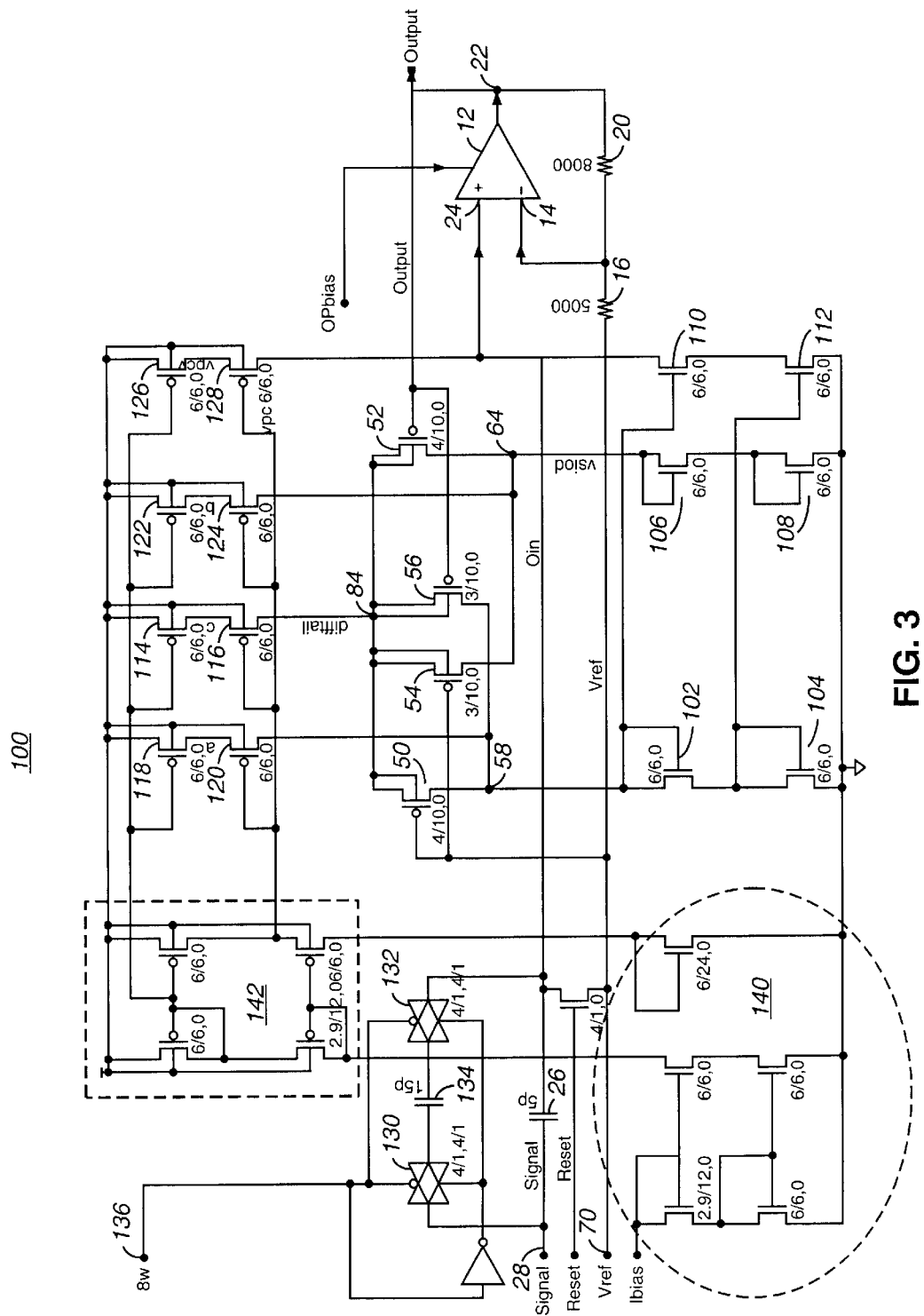
FIG. 3 is a schematic diagram of a low-corner frequency high pass circuit in accordance with one embodiment of the invention.

FIG. 3 is a schematic diagram of a low-corner frequency high pass circuit 100 in accordance with one embodiment of the invention. Note that the same reference numeral is used to designate the same item in different figures. The two differential amplifiers are clearly shown in the center of the figure. The operational amplifier 12 is shown on the far right of the figure. The current sink 66 (FIG. 2) is formed by two diode connected transistors 102, 104. The current sink 68 (FIG. 2) is formed by two diode connected transistors 106, 108. The output transistor 74 (FIG. 2) is formed by two transistors 110, 112. The first current mirror 78 (FIG. 2) is formed by two transistors 114, 116. The second current mirror 76 (FIG. 2) is formed by two transistors 118, 120. The third current mirror 80 (FIG. 2) is formed by two transistors 122, 124. The fourth current mirror 82 (FIG. 2) is formed by two transistors 126, 128.

The series capacitor 26 is shown on the left side of the figure and is connected to the input signal 28. A pair of switches 130, 132 form a switch network that connects the series capacitor 26 to a parallel capacitor 134. The control input 136 determines whether the parallel capacitor 134 is connected to the series capacitor 26. This allows the circuit 100 to change its corner frequency. The group of transistors 140, 142 are used to setup the bias currents for current mirrors.

Thus there has been described low-corner frequency high pass filter circuit that does not require large value capacitors or resistors. As a result the circuit is less expensive to implement in an integrated circuit.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A low-corner frequency high pass filter circuit comprising:

an operational amplifier having an inverting input, a non-inverting input and an output;

a first resistor connected between the inverting input and a reference voltage;

a feedback resistor connected between the inverting input and the output;

a series capacitor having a first end connected to the non-inverting input of the operational amplifier and a second end connected to an input signal; and a low gain amplifier, having an input connected to the output of the operational amplifier and having an output connected to the non-inverting input of the operational amplifier, wherein the low gain amplifier includes a first amplifier having a first gain and a second amplifier having a second gain, a first amplifier output being subtracted from a second amplifier output, wherein the first gain is different than the second gain.

2. The circuit of claim of 1, wherein the first amplifier is a differential amplifier having a first input connected to a reference voltage and a second input connected to the output of the operational amplifier.

3. The circuit of claim 2, wherein the second amplifier is a differential amplifier having a first input connected to a reference voltage and a second input connected to the output of the operational amplifier.

4. The circuit of claim 1, further including a second capacitor in parallel with the series capacitor.

5. The circuit of claim 4, further including a switching network connected to the second capacitor.

6. A low-corner frequency high pass filter circuit comprising:

an operational amplifier having an inverting input and a non-inverting input;

a series capacitor having a first end connected to the non-inverting input of the operational amplifier and a second end connected to an input signal;

a switching network connected to the series capacitor;

a parallel capacitor connected to the switching network; and a low gain amplifier having an input connected to an output of the operational amplifier and having an output connected to the non-inverting input of the operational amplifier.

7. The circuit of claim 6, wherein the low gain amplifier includes a first amplifier having a first gain and a second amplifier having a second gain, a first amplifier output being subtracted from a second amplifier output.

8. The circuit of claim of 7, wherein the first amplifier is a differential amplifier having a first input connected to a reference voltage and a second input connected to the output of the operational amplifier.

9. The circuit of claim 7, wherein the second amplifier is a differential amplifier having a first input connected to a reference voltage and a second input connected to the output of the operational amplifier.

* * * * *